United States Patent
Lee et al.

(10) Patent No.: US 8,398,783 B2
(45) Date of Patent: Mar. 19, 2013

(54) WORKPIECE DE-CHUCKING DEVICE OF PLASMA REACTOR FOR DRY-CLEANING INSIDE OF REACTION CHAMBER AND ELECTROSTATIC CHUCK DURING WORKPIECE DE-CHUCKING, AND WORKPIECE DE-CHUCKING METHOD USING THE SAME

(75) Inventors: Byoungil Lee, Suwon (KR); Hyeokjin Jang, Suwon (KR); Sungyong Ko, Suwon (KR); Minshik Kim, Suwon (KR)

(73) Assignee: DMS Co., Ltd., Suwon (KR)

( * ) Notice: Subject to any disclaimer, the term of this patent is extended or adjusted under 35 U.S.C. 154(b) by 352 days.

(21) Appl. No.: 12/854,545

(22) Filed: Aug. 11, 2010

(65) Prior Publication Data

US 2011/0056514 A1 Mar. 10, 2011

(30) Foreign Application Priority Data

Sep. 4, 2009 (KR) .......................... 10-2009-0083252

(51) Int. Cl.
*B08B 3/00* (2006.01)
(52) U.S. Cl. .................. 134/56 R; 134/58 R; 134/104.1; 134/133; 134/137
(58) Field of Classification Search .................. None
See application file for complete search history.

(56) References Cited

FOREIGN PATENT DOCUMENTS

| JP | 11-069855 | 3/1999 |
| JP | 2007-115839 | 5/2007 |
| KR | 1020080061814 | 7/2008 |

*Primary Examiner* — Eric Golightly
(74) *Attorney, Agent, or Firm* — IPLA P.A.; James E. Bame

(57) ABSTRACT

A workpiece de-chucking device of a plasma reactor for dry-cleaning the inside of a reaction chamber and an Electro-Static chuck (ESC) during workpiece de-chucking and a workpiece de-chucking method using the same are provided. The workpiece de-chucking device includes a lifting unit, an ICP source power unit, and a controller. The lifting unit lifts a workpiece mounted on a top surface of an ESC. The ICP source power unit forms a magnetic field in an inductive coil arranged outside a dielectric window. The controller outputs a source power control signal, a lift control signal, and a de-chucking control signal.

10 Claims, 7 Drawing Sheets

WORKPIECE DE-CHUCKING DEVICE OF PLASMA REACTOR FOR DRY-CLEANING INSIDE OF REACTION CHAMBER AND ELECTROSTATIC CHUCK DURING WORKPIECE DE-CHUCKING, AND WORKPIECE DE-CHUCKING METHOD USING THE SAME

CROSS REFERENCE

This application claims foreign priority under Paris Convention and 35 U.S.C. §119 to Korean Patent Application No. 10-2009-0083252, filed Sep. 4, 2009 with the Korean Intellectual Property Office.

BACKGROUND OF THE INVENTION

1. Technical Field

The present invention relates to a plasma reactor used for a semiconductor manufacturing process. More particularly, the present invention relates to a workpiece de-chucking device of a plasma reactor and a workpiece de-chucking method using the same.

2. Description of the Related Art

Commonly, ElectroStatic Chuck (ESC) is used to chuck a workpiece (e.g., a wafer or a glass substrate) to be etched or deposited with deposition materials, to the inside of a reaction chamber of a plasma reactor. The workpiece is chucked on the ESC by an attractive force of static electricity generated when a chucking power source is supplied to the ESC.

In order for an etching process or deposition process to be smoothly carried out, the workpiece has to be firmly chucked on the ESC. For example, the workpiece has to be chucked on the ESC enough to endure a pressure of 30 Torr or more of helium (He) gas that is a cooling gas applied to a rear surface of the workpiece. Accordingly, during the workpiece etching process or deposition process, a high-voltage Direct Current (DC) power source is supplied to an electrode of the ESC as a chucking power source.

In order to take out a workpiece completing etching or deposition treatment from the reaction chamber, a de-chucking process of de-chucking the workpiece firmly chucked to a top surface of the ESC from the ESC is needed. A conventional de-chucking method is briefly described below. If an etching process or deposition process ends, a chucking power source supplied to an ESC is cut off, and antistatic plasma is generated. By the antistatic plasma, charges existing between a workpiece and the ESC are completely discharged through a chamber body. If the antistatic plasma is off, the workpiece can be de-chucked from the ESC.

However, the conventional de-chucking method consumes a long time in completely discharging the charges between the workpiece and the ESC. Also, according to the conventional de-chucking method, it can frequently occur that the charges between the workpiece and the ESC remain without being completely discharged. This case can induce the popping phenomenon in which the workpiece is popped up without being well de-chucked from the ESC. Also, in a state where the workpiece is stuck to the ESC, the workpiece may be damaged due to a physical force resulting from the ascendance of a lifting unit. In case that the popping phenomenon takes place, the workpiece can leave its original position on the ESC, and particles can be generated.

If the workpiece leaves its original position on the ESC, this can become a cause of a failure of the workpiece because a position of the workpiece is changed when the workpiece is taken out from the reaction chamber and loaded in an external loading box or a next process for the workpiece is carried out. Also, in case that the popping phenomenon heavily occurs, the workpiece may be damaged.

Up to now, it is difficult to check if charges between a workpiece and an ESC are completely discharged. Thus, it is very difficult to reduce a popping or damage phenomenon occurring in a process of de-chucking the workpiece from the ESC, by the conventional de-chucking method.

On the other hand, during the etching process or deposition process and the de-chucking process, a surface of the ESC is contaminated due to polymer generated within the reaction chamber. Accordingly, after the workpiece is taken out from the reaction chamber, a dry-cleaning process of cleaning the surface of the ESC should be carried out for the sake of a next etching process or deposition process. In case that the etching process or deposition process is again carried out without the dry-cleaning process, the workpiece is not sufficiently firmly chucked to the ESC because of contaminants attached to the surface of the ESC. This causes an increase of a leakage of helium (He) gas applied to the rear surface of the workpiece, thus making a smooth workpiece treatment process difficulty. Accordingly, cleaning of the ESC is of much importance.

The conventional ESC cleaning process is separately carried out after a workpiece de-chucking process. Therefore, an ESC cleaning time is additionally consumed besides a workpiece de-chucking time. Resultantly, the number of processes (i.e., throughput) that can be treated by the plasma reactor during a set time is very limited. Thus, to increase the throughput of the plasma reactor, there is a demand for a method for reducing the workpiece de-chucking time and the ESC cleaning time.

SUMMARY OF THE INVENTION

An aspect of exemplary embodiments of the present invention is to address at least the problems and/or disadvantages and to provide at least the advantages described below. Accordingly, an aspect of exemplary embodiments of the present invention is to provide a workpiece de-chucking device of a plasma reactor for, while a workpiece is de-chucked from an ElectroStatic Chuck (ESC) by means of a lifting unit, generating and maintaining antistatic and cleaning plasma using an Inductively Coupled Plasma (ICP) source power unit or a Capacitively Coupled Plasma (CCP) top source power unit and allowing the antistatic and cleaning plasma to permeate into a space between the workpiece and the ESC, thereby allowing the antistatic and cleaning plasma to effectively discharge residual charges existing between the workpiece and the ESC through a closed circuit composed of the workpiece, the ESC, and the ground, and allowing the antistatic and cleaning plasma to dry-clean the inside of a reaction chamber and a surface of the ESC and eliminate fine dust generated while the workpiece is de-chucked from the ESC by means of the lifting unit.

Another aspect of exemplary embodiments of the present invention is to provide a workpiece de-chucking method of a plasma reactor for, while a workpiece is de-chucked from an ESC by means of a lifting unit, generating and maintaining antistatic and cleaning plasma using an ICP source power unit or a CCP top source power unit and allowing the antistatic and cleaning plasma to permeate into a space between the workpiece and the ESC, thereby allowing the antistatic and cleaning plasma to effectively discharge residual charges existing between the workpiece and the ESC through a closed circuit composed of the workpiece, the ESC, and the ground, and allowing the antistatic and cleaning plasma to dry-clean the inside of a reaction chamber and a surface of the ESC and eliminate fine dust generated while the workpiece is de-chucked from the ESC by means of the lifting unit.

According to one aspect of the present invention, a workpiece de-chucking device of a plasma reactor is provided. The device includes a lifting unit, an ICP source power unit, and a controller. In response to a lift control signal, the lifting unit lifts a workpiece mounted on a top surface of an ESC. When the workpiece is lifted, the lifting unit supports the workpiece such that a gap between a central part of a bottom surface of the workpiece and the top surface of the ESC is maintained in the same state as a gap between an edge part of the bottom surface of the workpiece and the top surface of the ESC.

The ICP source power unit includes an inductive coil and a Radio Frequency (RF) power source supply unit. The inductive coil is arranged outside a dielectric window installed at a top of a reaction chamber having the ESC, and forms a magnetic field when an RF power source is supplied. The RF power source supply unit supplies the RF power source to the inductive coil in response to a source power control signal.

The controller controls an operation of the plasma reactor comprising the reaction chamber. For the sake of de-chucking the workpiece, the controller outputs the source power control signal, the lift control signal, and a de-chucking control signal, and controls a mass flow of a de-chuck gas injected into the reaction chamber during the de-chucking of the workpiece and a pressure of the reaction chamber.

As the de-chuck gas is injected into the reaction chamber and the inductive coil forms the magnetic field, antistatic and cleaning plasma is generated in the reaction chamber.

In response to the de-chucking control signal, a chucking power source supply unit stops supplying a chucking power source to an electrode of the ESC and connects the electrode of the ESC to the ground.

When the workpiece is lifted by the lifting unit, the antistatic and cleaning plasma permeates into a space between the workpiece and the ESC, promotes discharge of charges existing between the workpiece and the ESC, dry-cleans a surface of the ESC and the inside of the reaction chamber, and eliminates fine dust generated while the workpiece is de-chucked from the ESC by the lifting unit.

According to another aspect of the present invention, a workpiece de-chucking method of a plasma reactor is provided. The method includes generating antistatic and cleaning plasma within a reaction chamber using an inductive coil of an ICP source power unit, forming a discharge path of charges existing between a workpiece mounted on a top surface of an ESC installed within the reaction chamber and the ESC, de-chucking the workpiece from the ESC by a lifting unit, waiting during a set time after lifting the workpiece up to the maximum height by the lifting unit, and stopping generating the antistatic and cleaning plasma.

When the workpiece is de-chucked, a gap between a central part of a bottom surface of the workpiece and the top surface of the ESC is maintained in the same state as a gap between an edge part of the bottom surface of the workpiece and the top surface of the ESC. When the workpiece is de-chucked from the ESC by the lifting unit, the antistatic and cleaning plasma permeates into a space between the workpiece and the ESC. As a result, a closed circuit composed of the workpiece, the ESC, and the ground is formed. Through the closed circuit, the antistatic and cleaning plasma promotes discharge of residual charges existing between the workpiece and the ESC. The antistatic and cleaning plasma dry-cleans the inside of the reaction chamber and a surface of the ESC, and eliminates fine dust generated while the workpiece is de-chucked from the ESC by the lifting unit.

BRIEF DESCRIPTION OF THE DRAWINGS

The above and other objects, features and advantages of the present invention will become more apparent from the following detailed description when taken in conjunction with the accompanying drawings in which.

Throughout the drawings, the same drawing reference numerals will be understood to refer to the same elements, features and structures.

DETAILED DESCRIPTION

Exemplary embodiments of the present invention will now be described in detail with reference to the annexed drawings. In the following description, a detailed description of known functions and configurations incorporated herein has been omitted for conciseness.

Figure 1:
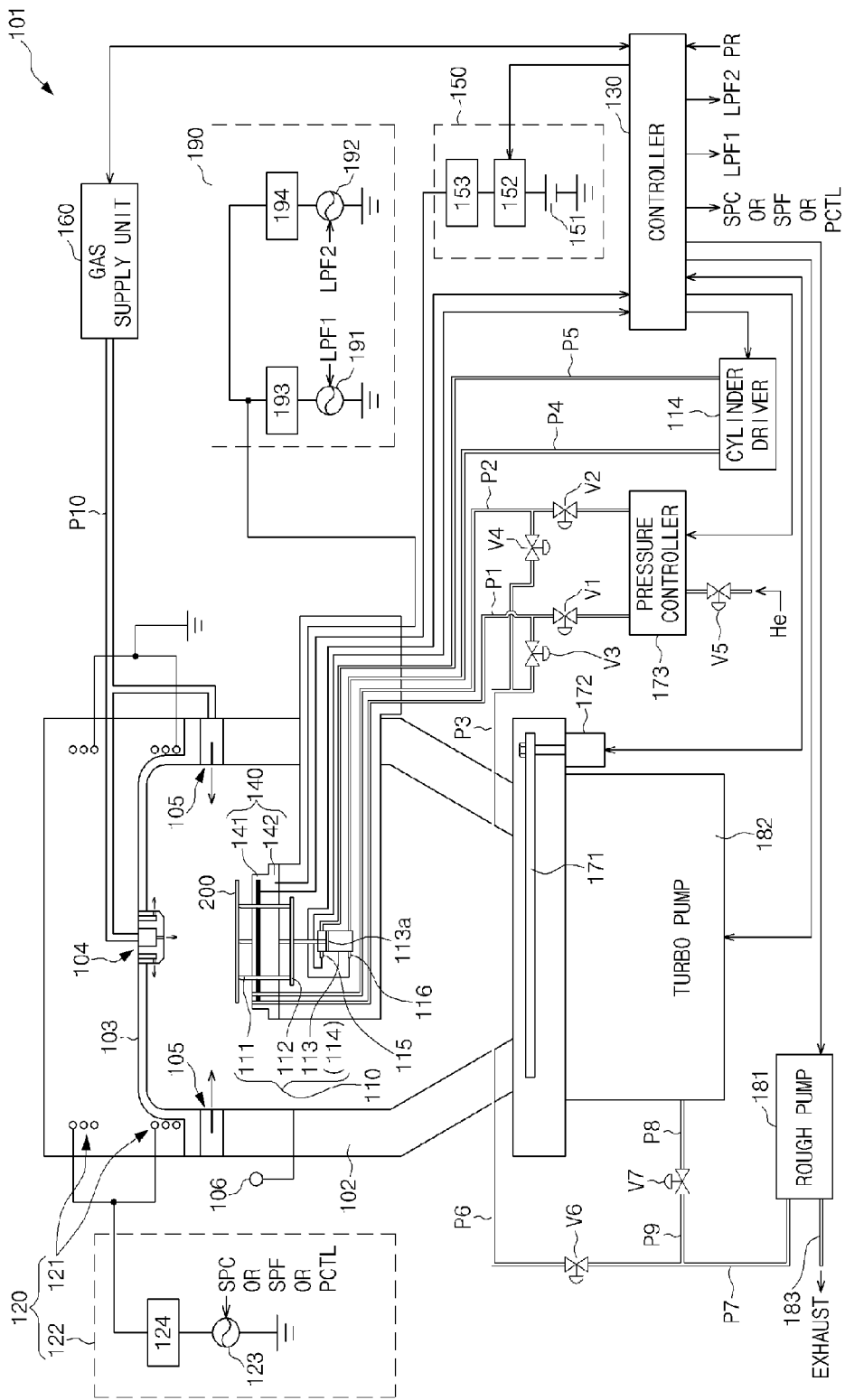
FIG. 1 is a schematic diagram illustrating a plasma reactor including a workpiece de-chucking device according to an exemplary embodiment of the present invention.

FIG. 1 is a schematic diagram illustrating a plasma reactor 101 including a workpiece de-chucking device 100 according to an exemplary embodiment of the present invention. For simplicity, FIG. 1 illustrates only parts related to the present invention, and omits illustration of partial transmit/receive signals between respective constituent elements.

A workpiece de-chucking device 100 includes a lifting unit 110, an ICP source power unit 120, and a controller 130. The lifting unit 110 gets a workpiece 200 mounted on a top surface of an ElectroStatic Chuck (ESC) 140 to ascend or descend at a set speed. The set speed is within a range of about $X(3.125 \text{ mm/s} \leq X \leq 12.5 \text{ mm/s})$, which is a speed causing no popping phenomenon when the workpiece 200 is de-chucked from the ESC 140, for example.

The ESC 140 includes an electrode 141 and a ceramic coating film 142. The ceramic coating film 142 is coated on an exterior surface of the electrode 141. If a Direct Current (DC) voltage is applied to the electrode 141, polarization takes place in the ceramic coating film 142, and the workpiece is chucked to the ESC 140. A chucking power source supply unit 150 is connected to the electrode 141, and a bias power source supply unit 190 is connected to a bottom part of the ESC 140.

The chucking power source supply unit 150 includes a DC voltage source 151, a high voltage generator 152, and a Radio Frequency (RF) noise filter 153. The high voltage generator 152 generates a chucking power source of a high voltage on the basis of a DC voltage of the DC voltage source 151. In response to a chucking control signal (CK) received from the controller 130, the high voltage generator 152 supplies a chucking power source to the electrode 141 through the RF noise filter 153. Also, in response to a de-chucking control signal (DCK) received from the controller 130, the high voltage generator 152 stops supplying the chucking power source to the electrode 141, and connects the electrode 141 to the ground. At this time, the electrode 141 is connected to the ground through an output resistance of the high voltage generator 152.

The bias power source supply unit 190 can include a low frequency RF bias generator 191, a high frequency RF bias generator 192, and bias impedance matching circuits 193 and 194. The bias power source supply unit 190 is controlled by the controller 130. During a workpiece etching process or deposition process, in response to bias control signals (LPC1 and LPC2) (not shown) received from the controller 130, the bias power source supply unit 190 mixes a low frequency bias RF power source with a high frequency bias RF power source and supplies the mixed result to the bottom part of the ESC 140. In FIG. 1, the bias power source supply unit 190 mixing the low frequency bias RF power source with the high frequency bias RF power source and supplying the mixed result to the bottom part of the ESC 140 is illustrated as one example, but the bias power source supply unit 190 can be variously modified in construction and operation according to need.

Figure 2:
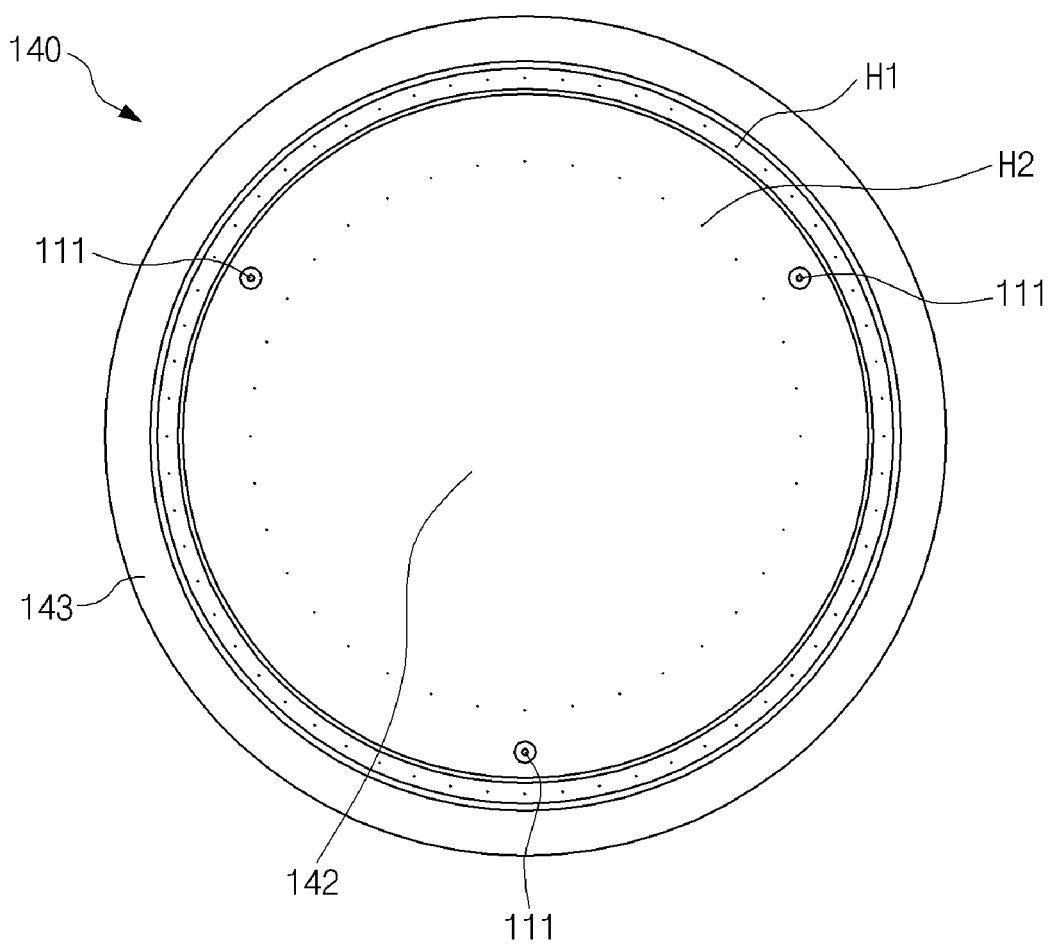
FIG. 2 is a plane diagram of an ElectroStatic Chuck (ESC) illustrated in FIG. 1.

The lifting unit 110 includes a plurality of lift pins 111, a lift pin support 112, a cylinder 113, and a cylinder driver 114. The plurality of lift pins 111 support a bottom surface of the workpiece 200 at their one ends when the workpiece 200 ascends or descends. As illustrated in FIG. 2, the lift pins 111 can be, for example, three in number. Also, the number of the lift pins 111 can increase according to need. The plurality of lift pins 111 are installed passing through the ESC 140.

The lift pin support 112 is installed below the ESC 140. The lift pin support 112 is coupled to the other ends of the plurality of lift pins 111 and supports the plurality of lift pins 111. The cylinder 113 includes a piston 113a coupled to the lift pin support 112. By means of a pressure of air injected through a pipe (P4 or P5), the piston 113a moves up/down, thus getting the lift pin support 112 coupled to the piston 113a to ascend or descend. As the cylinder 113 makes the lift pin support 112 ascended or descended, the plurality of lift pins 111 ascend or descend.

In response to a lift control signal (LCTL) received from the controller 130, the cylinder driver 114 injects air into the cylinder 113 through the pipe (P4) such that the piston 113a ascends. Also, in response to a fall control signal (FCTL) received from the controller 130, the cylinder driver 114 injects air into the cylinder 113 through the pipe (P5) such that the piston 113a descends.

When the workpiece 200 mounted on a top surface of the ESC 140 ascends or descends, the lifting unit 110 (i.e., the plurality of lift pins 111 of the lifting unit 110) supports the workpiece 200 such that a gap between a central part of the bottom surface of the workpiece 200 and the top surface of the ESC 140 is maintained in the same state as a gap between an edge part of the bottom surface of the workpiece 200 and the top surface of the ESC 140.

The ICP source power unit 120 includes an inductive coil 121 and an RF power source supply unit 122. The inductive coil 121 is arranged outside of a dielectric window 103 installed at a top of the reaction chamber 102 containing the ESC 140. The inductive coil 121 forms a magnetic field when an RF power source is supplied. As a de-chuck gas is injected into the reaction chamber 102 and the inductive coil 121 forms the magnetic field, antistatic and cleaning plasma is generated inside the reaction chamber 102.

When the workpiece 200 is lifted by the lifting unit 110, the antistatic and cleaning plasma can permeate into a space between the workpiece 200 and the ESC 140. As a result, a closed circuit composed of the workpiece 200, the ESC 140, and the ground is formed and, through the closed circuit, the antistatic and cleaning plasma effectively discharges residual charges existing between the workpiece 200 and the ESC 140. Also, the antistatic and cleaning plasma dry-cleans the inside of the reaction chamber 102 and a surface of the ESC 140, and eliminates fine dust generated while the workpiece 200 is de-chucked from the ESC 140 by the lifting unit 110.

The RF power source supply unit 122 includes an RF source power generator 123 and a matching circuit (i.e., an RF matcher) 124. The RF source power generator 123 generates an RF power source in response to a source power control signal (SPC) received from the controller 130. The RF source power generator 123 supplies an RF power source to the inductive coil 121 through the matching circuit 124. In response to a power control signal (PCTL) received from the controller 130, the RF source power generator 123 changes a power value of an RF power source supplied to the inductive coil 121. Also, in response to a source power off signal (SPF) received from the controller 130, the RF source power generator 123 stops supplying an RF power source to the inductive coil 121.

The controller 130 controls an operation of the plasma reactor 101 including the reaction chamber 102. For the sake of de-chucking the workpiece 200, the controller 130 outputs a source power control signal (SPC), a lift control signal (LCTL), and a de-chucking control signal (DCK). The controller 130 controls a mass flow of a de-chuck gas injected into the reaction chamber 102 during the de-chucking of the workpiece 200 and a pressure of the reaction chamber 102. The de-chuck gas can include argon (Ar), oxygen ($O_2$), or a mixture of argon (Ar) and oxygen ($O_2$).

In response to the de-chucking control signal (DCK) received from the controller 130, the chucking power source supply unit 150 stops supplying a chucking power source, which is a DC power source, to the electrode 141 of the ESC 140, and connects the electrode 141 of the ESC 140 to the ground.

A lift sensor 115 can be installed at an upper part of one side of the cylinder 113, and a fall sensor 116 can be installed at a lower part of the one side of the cylinder 113. The lift sensor 115 senses the piston 113a lifted to the top height, and outputs a sense signal to the controller 130. The fall sensor 116 senses the piston 113a falling to the bottom height, and outputs a sense signal to the controller 130. On the basis of the sense signal of the lift sensor 115, the controller 130 recognizes that the workpiece 200 is lifted to the top height. Also, on the basis of the sense signal of the fall sensor 116, the controller 130 recognizes that the workpiece 200 falls to the bottom height.

The controller 130 includes a storage space (not shown). The storage space of the controller 130 can store a reference power value for an RF power source supplied to the inductive coil 121, and a de-chucking power value. The storage space can store the number of times of up/down iterative movement of the lifting unit 110, an ascent and descent speed of the lifting unit 110, an internal pressure of the reaction chamber 102, a variety of kinds of delay time, an operation time, a waiting time, etc. Also, the storage space of the controller 130 can additionally store other setting values associated with an operation of the plasma reactor 101. The setting values stored in the storage space of the controller 130 can be variously modified in size and kind according to user's need.

For the sake of the workpiece etching process, the controller 130 outputs a source power control signal (SPC) and a chucking control signal (CK). The controller 130 controls a mass flow of an etching gas injected into the reaction chamber 102 during the etching process, and a pressure of the reaction chamber 102. As the etching gas is injected into the reaction chamber 102 and the inductive coil 121 forms the magnetic field, etching plasma is generated within the reaction chamber 102.

A chamber gate valve 171 is installed below the reaction chamber 102. The chamber gate valve 171 is opened or closed by a motor 172. A turbo pump 182 is installed below the chamber gate valve 171. A rough pump 181 is connected to one side of the reaction chamber 102 through a pipe (P6), a valve (V6), and a pipe (P7). A pipe (P8) installed at one side of the turbo pump 182 is connected to the pipe (P7) through a valve (V7) and a pipe (P9). An exhaust pipe 183 is installed at one side of the rough pump 181. The controller 130 can control an open/close operation of the valves (V6 and V7).

The rough pump 181 and the turbo pump 182 exhaust out residual gas and air within the reaction chamber 102 to make the inside of the reaction chamber 102 in a vacuum state. When the turbo pump 182 does not work and only the rough pump 181 works, the valve (V6) is opened and the valve (V7) is closed. When the rough pump 181 and the turbo pump 182 both work, the valve (V6) is closed and the valve (V7) is opened. The rough pump 181 roughly controls an internal pressure of the reaction chamber 102, and the turbo pup 182 delicately controls the internal pressure of the reaction chamber 102.

Figure 3:
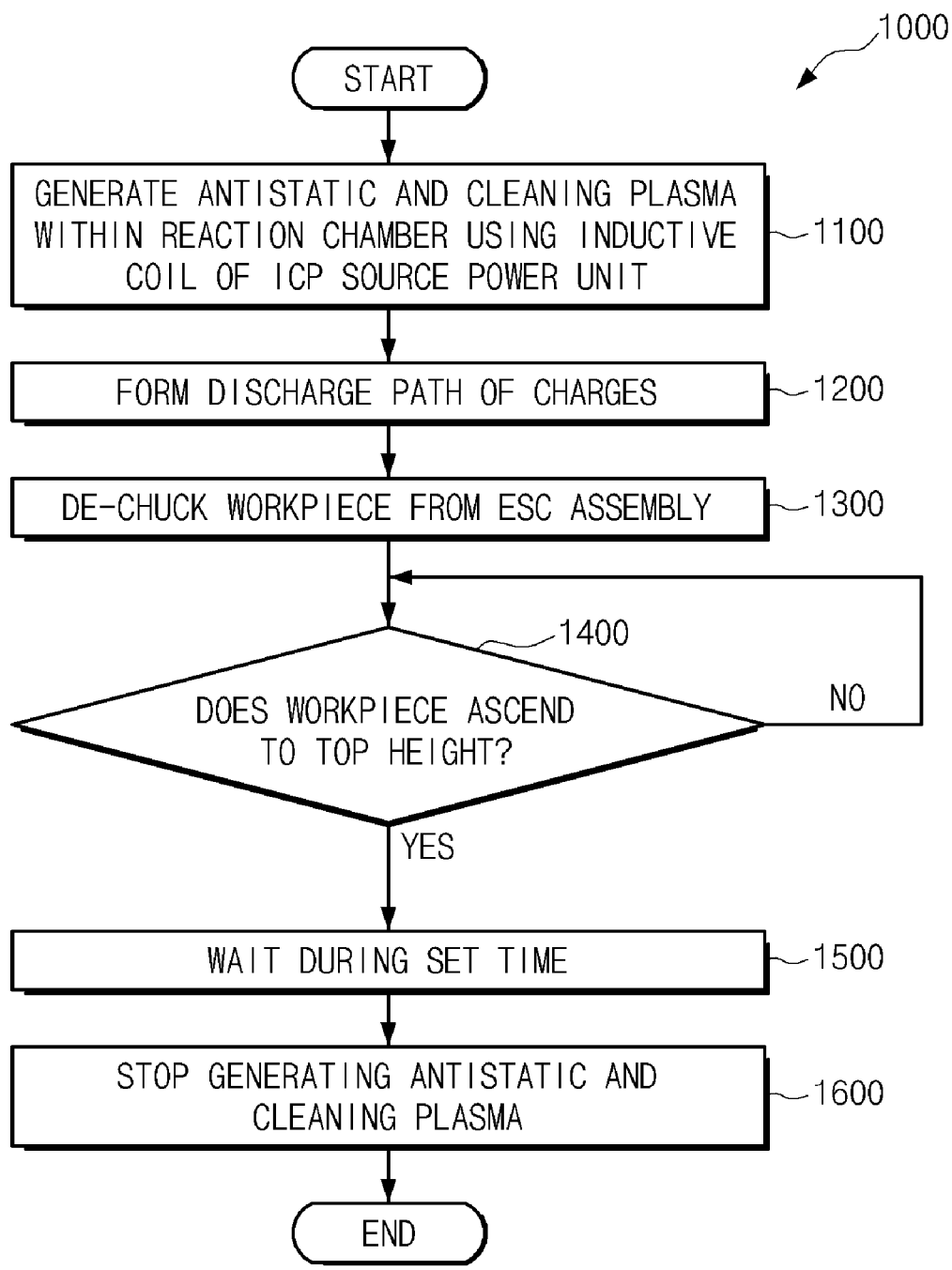
FIG. 3 is a flow diagram illustrating a workpiece de-chucking process of a plasma reactor illustrated in FIG. 1.

Next, a process of de-chucking the workpiece 200 using the workpiece de-chucking device is described in detail. FIG. 3 is a flow diagram illustrating a workpiece de-chucking process (1000) of the plasma reactor illustrated in FIG. 1.

In step 1100, the controller 130 generates antistatic and cleaning plasma within the reaction chamber 102 using the inductive coil 121 of the ICP source power unit 120.

In step 1200, the controller 130 controls the chucking power source supply unit 150 to form a discharge path of charges existing between the workpiece 200 mounted on the top surface of the ESC 140 installed within the reaction chamber 102 and the ESC 140.

In step 1300, under control of the controller 130, the lifting unit 110 de-chucks the workpiece 200 from the ESC 140. When the workpiece 200 is de-chucked, a gap between a central part of a bottom surface of the workpiece 200 and the top surface of the ESC 140 is maintained in the same state as a gap between an edge part of the bottom surface of the workpiece 200 and the top surface of the ESC 140.

Also, when the workpiece 200 is de-chucked from the ESC 140 by the lifting unit 110, the antistatic and cleaning plasma can permeate into a space between the workpiece 200 and the ESC 140. As a result, a closed circuit composed of the workpiece, the ESC 140, and the ground is formed and, through the closed circuit, the antistatic and cleaning plasma effectively discharges residual charges existing between the workpiece 200 and the ESC 140. Also, the antistatic and cleaning plasma dry-cleans the inside of the reaction chamber 102 and the surface of the ESC 140, and eliminates fine dust generated while the workpiece 200 is de-chucked from the ESC 140 by the lifting unit 110.

During the workpiece de-chucking process, clean chemistry plasma is used as the antistatic and cleaning plasma, thereby being capable of promoting a discharge of residual charges through the closed circuit and simultaneously dry-cleaning the inside of the reaction chamber 102 and the surface of the ESC 140, and performing a supplementary function of eliminating fine dust generated while the workpiece 200 is de-chucked from the ESC 140 by the lifting unit 110.

After that, in step 1400, the controller 130 determines if the workpiece 200 is lifted to the top height by the lifting unit 110 depending on whether it receives a sense signal from the lift sensor 115.

After the workpiece 200 is lifted to the top height by the lifting unit 110, in step 1500, the controller 130 waits during a set time. As a result, during the set time, the antistatic and cleaning plasma keeps dry-cleaning the surface of the ESC 140. By manipulating an input means (not shown), a user can arbitrarily set a time during which the controller 130 waits in step 1500 in the storage space of the controller 130.

Next, in step 1600, the controller 130 controls the ICP source power unit 120 to stop generating the antistatic and cleaning plasma.

Figure 4:
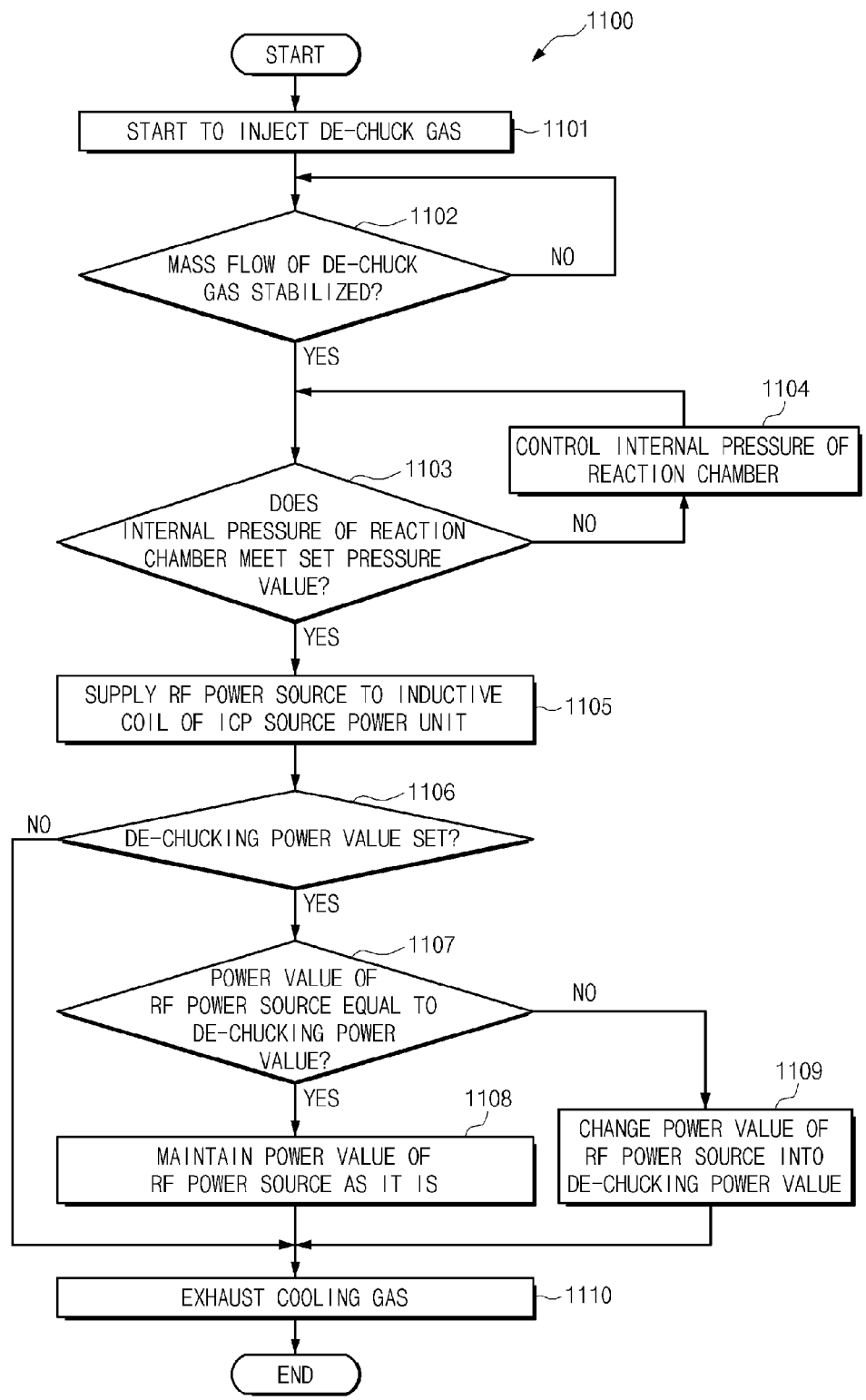
FIG. 4 is a flow diagram illustrating a detail of step 1100 illustrated in FIG. 3.

FIG. 4 is a flow diagram illustrating a detail of step 1100 illustrated in FIG. 3.

In step 1101, the controller 130 controls a gas supply unit 160 to inject a de-chuck gas into the reaction chamber 102. In more detail, the controller 130 outputs a de-chuck gas injection signal (DKGAS) to the gas supply unit 160. In response to the de-chuck gas injection signal (DKGAS), the gas supply unit 160 supplies a de-chuck gas to gas injectors 104 and 105 through a pipe (P10). At this time, the gas supply unit 160 outputs mass flow information of the de-chuck gas discharged from the gas supply unit 160, to the controller 130. Thus, in step 1102, the controller 130 determines if a mass flow of the de-chuck gas is stabilized to a set mass flow value on the basis of the mass flow information received from the gas supply unit 160.

If the mass flow of the de-chuck gas is stabilized to the set mass flow value, in step 1103, the controller 130 determines if an internal pressure of the reaction chamber 102 meets a set pressure value, on the basis of pressure measurement information (PR) received from a chamber pressure gauge 106.

If the internal pressure of the reaction chamber 102 does not meet the set pressure value, in step 1104, the controller 130 controls the internal pressure of the reaction chamber 102 by controlling an extent of opening of the chamber gate valve 171 installed below the reaction chamber 102. The controller 130 can control the motor 172 to control the extent of opening of the chamber gate valve 171. After that, the controller 130 repeats an operation of step 1103.

If the internal pressure of the reaction chamber 102 meets the set pressure value, the controller 130 outputs a source power control signal (SPC) to the RF power source supply unit 122. As a result, in response to the source power control signal (SPC), in step 1105, the RF power source supply unit 122 supplies an RF power source to the inductive coil 121. At this time, the RF power source supply unit 122 supplies an RF power source of a preset reference power value to the inductive coil 121, and outputs information on the power value of the RF power source supplied to the inductive coil 121, to the controller 130.

Next, in step 1106, the controller 130 determines if a de-chucking power value is set in the storage space of the controller 130. By manipulating an input means (not shown), a user can arbitrarily set a de-chucking power value in the storage space of the controller 130.

If the de-chucking power value is set in the storage space of the controller 130, in step 1107, the controller 130 determines if the power value of the RF power source (i.e., the reference power value) is equal to the de-chucking power value. If the power value of the RF power source is equal to the de-chucking power value, in step 1108, the controller 130 maintains the power value of the RF power source as it is.

If the power value of the RF power source is not the same as the de-chucking power value, the controller 130 outputs a power control signal (PCTL) to the RF power source supply unit 122. As a result, in response to the power control signal (PCTL), in step 1109, the RF power source supply unit 122 changes the power value of the RF power source supplied to the inductive coil 121 into the de-chucking power value. For example, when the power value of the RF power source generated in step 1105 is 600 W and the de-chucking power value is 300 W, the RF power source supply unit 122 drops the power value of the RF power source supplied to the inductive coil 121, from 600 W to 300 W.

Alternately, whenever receiving the power control signal (PCTL), the RF power source supply unit 122 can drop the power value of the RF power source supplied to the inductive coil 121, in a unit of set power value. At this time, on the basis of information on the power value of the RF power source received from the RF power source supply unit 122, the controller 130 can check if the power value of the RF power source reaches the de-chucking power value.

When the de-chucking power value is not set in the storage space of the controller 130 in step 1106, or after step 1108 or step 1109 is performed, in step 1110, the controller 130 controls a cooling gas, which is jetted to the bottom surface of the workpiece 200 for the sake of cooling the workpiece 200, to be exhausted outside the reaction chamber 102.

In more detail, in the workpiece etching process or deposition process, a helium (He) gas, a cooling gas, is jetted to the bottom surface of the workpiece 200. As illustrated in FIG. 2, the ESC 140 has a plurality of gas jet holes (H1 and H2), and the plurality of gas jet holes (H1 and H2) connect to pipes (P1 and P2), respectively. The pipes (P1 and P2) pass through the ESC 140 and connect to the plurality of gas jet holes (H1 and H2).

In the etching process or deposition process, the controller 130 opens valves (V1, V2, and V5), and closes valves (i.e., dump valves) (V3 and V4). The controller 130 can output open/close control signals (not shown) to the valves (V1 to V5), respectively, to control open/close operations of the valves (V1 to V5). Also, in the etching process or deposition process, the controller 130 controls a pressure controller 173 to control a pressure of a cooling gas supplied to the pipes (P1 and P2).

When the workpiece 200 is de-chucked, the controller 130 closes the valves (V1, V2, and V5) and opens the valves (V3 and V4). Resultantly, cooling gases remaining within the pipes (P1 and P2) are exhausted out passing through opening regions of a pipe (P3), the reaction chamber 102, and the chamber gate valve 171 in regular sequence.

Figure 5:
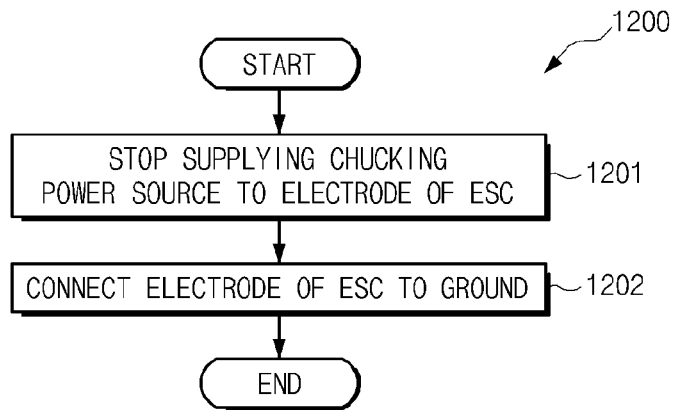
FIG. 5 is a flow diagram illustrating a detail of step 1200 illustrated in FIG. 3.

FIG. 5 is a flow diagram illustrating a detail of step 1200 illustrated in FIG. 3.

The controller 130 outputs a de-chucking control signal (DCK) to the chucking power source supply unit 150. As a result, in response to the de-chucking control signal (DCK), in step 1201, the chucking power source supply unit 150 stops supplying a chucking power source to the electrode 141 of the ESC 140. Next, in step 1202, the chucking power source supply unit 150 connects the electrode 141 of the ESC 140 to the ground. Although not illustrated in detail in FIG. 1, the chucking power source supply unit 150 connects the electrode 141 to the ground through an internal circuit.

On the other hand, when the workpiece 200 is de-chucked, the controller 130 outputs bias off signals (LPF1 and LPF2) to the bias power source supply unit 190. As a result, the bias power source supply unit 190 stops supplying a bias RF power source to a bottom part of the ESC 140. The reason of stopping supplying the bias RF power source to the bottom part of the ESC 140 at the time of de-chucking of the workpiece 200 is to prevent a phenomenon in which charges are accumulated by a self bias in the ESC.

Figure 8:
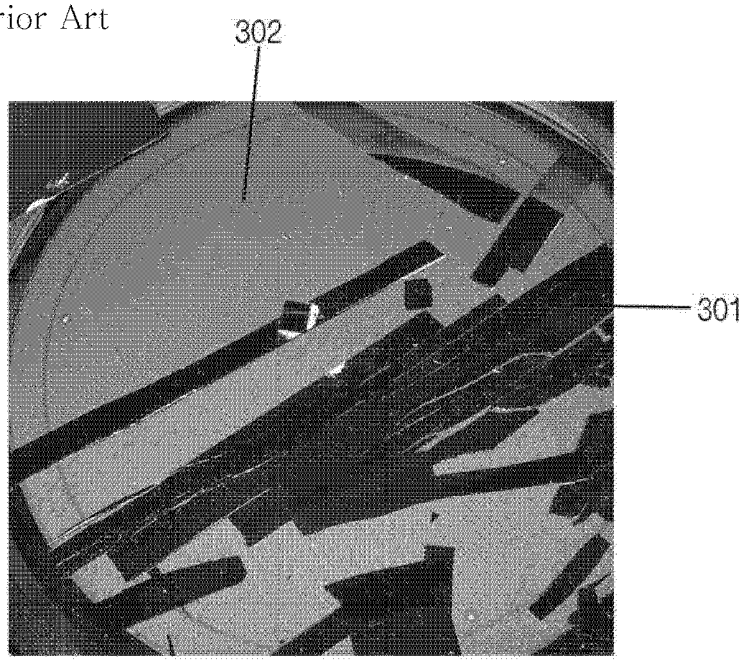
FIG. 8 is a photograph illustrating a state in which, when a workpiece is de-chucked, the workpiece is damaged and attached to a top surface of an ESC, in a plasma reactor not equipped with an ICP source power unit as a comparative example of a plasma reactor including a workpiece de-chucking device according to an exemplary embodiment of the present invention.

For instance, a plasma reactor not equipped with an ICP source power unit 120 or a Capacitively Coupled Plasma (CCP) top source power unit 120' (FIG. 9) needs to supply a bias RF power source to the bottom part of the ESC to generate antistatic and cleaning plasma within the reaction chamber. At this time, a self bias is generated by the bias RF power source, thus promoting the accumulation of charges in the ESC. The charges accumulated in the ESC interrupt the de-chucking of the workpiece from the ESC, thus inducing the sticking phenomenon. Resultantly, as illustrated in FIG. 8, this causes a serious problem that a workpiece 301 is stuck to a top surface of an ESC 302 as damaged without being de-chucked from the ESC 302. The ESC to which the workpiece 301 is stuck as damaged is contaminated by debris of the damaged workpiece 301. Removal of the debris consumes a long time. During an ESC cleaning time, a user cannot use the plasma reactor and thus, a decrease of productivity is brought about.

Unlike this, a plasma reactor including an ICP source power unit 120 or a CCP top source power unit 120' does not need to supply a bias RF power source to a bottom part of an ESC because the ICP source power unit 120 or the CCP top source power unit 120' generates antistatic and cleaning plasma within a reaction chamber, thus being able to prevent a phenomenon in which charges are accumulated in the ESC by a self bias.

The plasma reactor including the CCP top source power unit 120' can prevent the phenomenon in which charges are accumulated in the ESC, but deteriorates an effect of cleaning the inside of the reaction chamber and the ESC because a plasma density is greatly deteriorated compared to the plasma reactor including the ICP source power unit 120. Also, in the plasma reactor including the CCP top source power unit 120', a user has to endure a damage of an upper electrode caused by sputtering. Therefore, it is more desirable that a workpiece de-chucking device and method according to the present invention are applied to the plasma reactor including the ICP source power unit 120 rather than the CCP top source power unit 120'.

Figure 6:
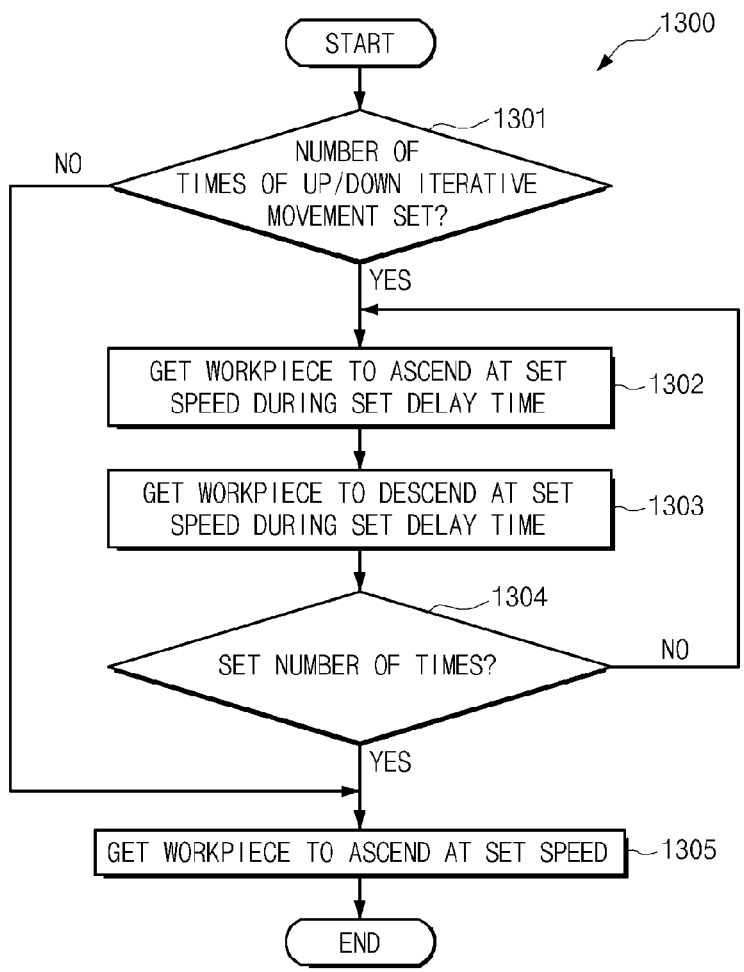
FIG. 6 is a flow diagram illustrating a detail of step 1300 illustrated in FIG. 3.

FIG. 6 is a flow diagram illustrating a detail of step 1300 illustrated in FIG. 3.

In step 1301, the controller 130 determines if the number of times of up/down iterative movement of the workpiece 200 is preset. The number of times of up/down iterative movement of the workpiece 200 can be set to at least one time.

If the number of times of up/down iterative movement of the workpiece 200 is preset, in step 1302, the controller 130 controls the lifting unit 110 to lift the workpiece 200 at a set speed during a set delay time (T). In more detail, the controller 130 outputs a lift control signal (LCTL) to the cylinder driver 114, and waits during the set delay time (T). Here, the set delay time is a time (T) meeting the condition of about $0 < T \leq 0.6$ seconds. The set speed is within a range of about $X(3.125 \text{ mm/s} \leq X \leq 12.5 \text{ mm/s})$.

In response to the lift control signal (LCTL), the cylinder driver 114 injects air to the cylinder 113 through the pipe (P4). As a result, as the piston 113a of the cylinder 113 moves up, the lift pin support 112 and the lift pin 111 ascend, and the workpiece 200 is de-chucked from the ESC 140.

After the set delay time (T), in step 1303, the controller 130 controls the lifting unit 110 to get the workpiece 200 to descend at a set speed during a set delay time (T). In more detail, the controller 130 outputs a fall control signal (FCTL) to the cylinder driver 114, and waits during the set delay time (T).

In response to the fall control signal (FCTL), the cylinder driver 114 injects air into the cylinder 113 through the pipe (P5). As a result, as the piston 113a of the cylinder 113 moves down, the lift pin support 112 and the lift pin 111 descend, and the workpiece 200 descends and gets in contact with the top surface of the ESC 140.

In step 1304, the controller 130 counts the number of times of ascent and descent of the workpiece 200, and determines if the counted number of times reaches the set number of times. If the number of times of ascent and descent of the workpiece 200 does not reach the set number of times, the controller 130 repeats operations of steps 1302 and 1303.

If the number of times of ascent and descent of the workpiece 200 reaches the set number of times in step 1304 or if the number of times of up/down iterative movement of the workpiece 200 is not preset in step 1301, in step 1305, the controller 130 controls the lifting unit 110 to lifts the workpiece 200 up to the top height at a set speed.

Figure 7:
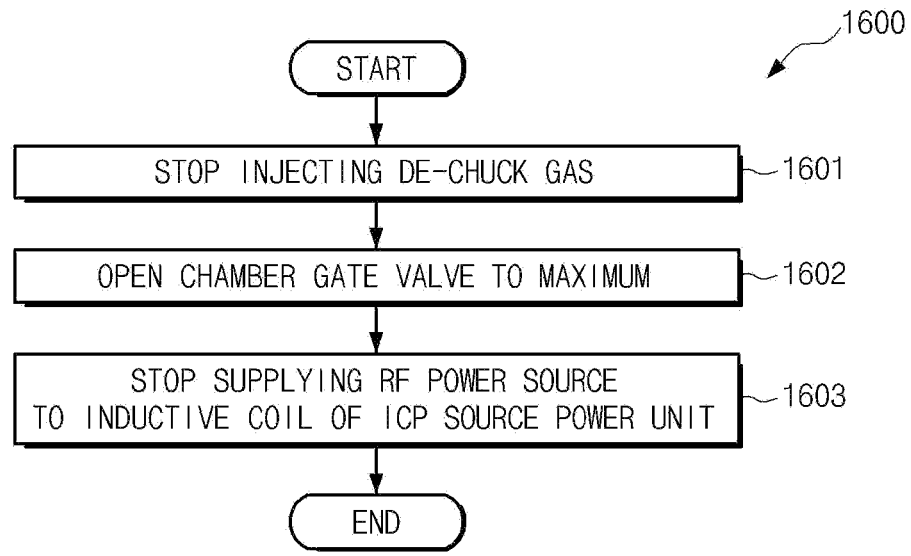
FIG. 7 is a flow diagram illustrating a detail of step 1600 illustrated in FIG. 3.

FIG. 7 is a flow diagram illustrating a detail of step 1600 illustrated in FIG. 3.

In step 1601, the controller 130 controls the gas supply unit 160 to stop injecting a de-chuck gas into the reaction chamber 102. In more detail, the controller 130 outputs a de-chuck gas stop signal (DKGASST) to the gas supply unit 160 and, in response to the de-chuck gas stop signal (DKGASST), the gas supply unit 160 stops supplying the de-chuck gas to the gas injectors 104 and 105.

In step 1602, the controller 130 controls the motor 172 to open the chamber gate valve 171 to the maximum. The controller 130 outputs a source power off signal (SPF) to the RF power source supply unit 122. As a result, in response to the source power off signal (SPF), in step 1603, the RF power source supply unit 122 stops supplying an RF power source to the inductive coil 121. By this, the de-chucking of the workpiece 200 is completed.

Figure 9:
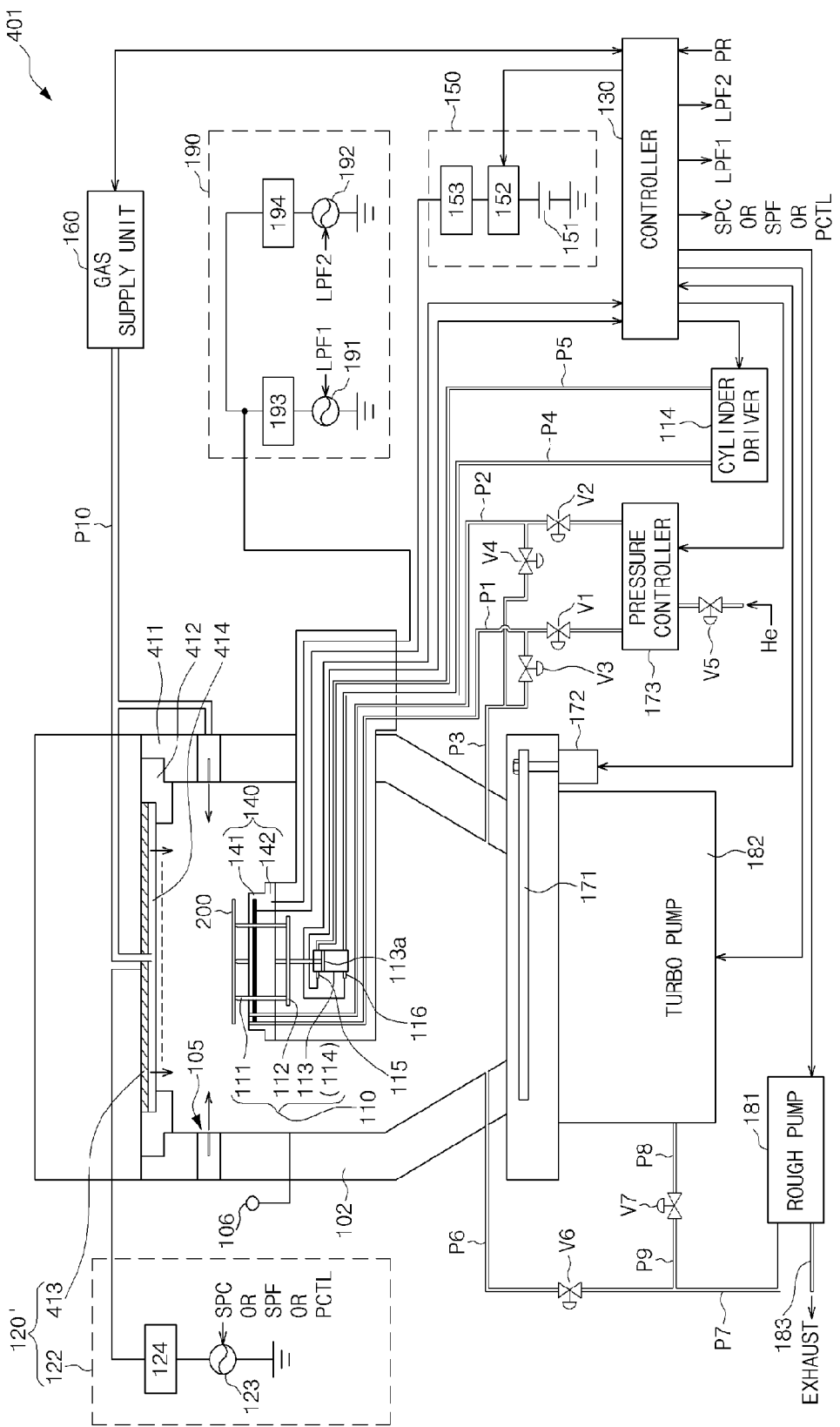
FIG. 9 is a schematic diagram illustrating a plasma reactor including a workpiece de-chucking device according to another exemplary embodiment of the present invention.

FIG. 9 is a schematic diagram illustrating a plasma reactor 401 including a workpiece de-chucking device 100' according to another exemplary embodiment of the present invention.

A construction and operation of the plasma reactor 401 are similar with those of the plasma reactor 101 described above with reference to FIG. 1. Also, a construction and operation of the workpiece de-chucking device 100' are similar with those of the workpiece de-chucking device 100 described above with reference to FIG. 1. Accordingly, in this exemplary embodiment, a description is made centering on a difference between the workpiece de-chucking devices 100 and 100' in order to avoid the redundancy of description.

The difference between the workpiece de-chucking devices 100 and 100' is that the workpiece de-chucking device 100' includes a CCP top source power unit 120' in place of an ICP source power unit 120. The CCP top source power unit 120' includes an RF power source supply unit 122 and an upper electrode 413. The upper electrode 413 is fixed by an insulating part 412 contained within an opening of a chamber upper body 411 installed at a top of a reaction chamber 102. The opening of the chamber top body 411 is sealed by the upper electrode 413 and the insulating part 412. The chamber top body 411 is grounded. The RF power source supply unit 122 is controlled by the controller 130, and supplies an RF power source to the upper electrode 413.

A Gas Distribution Plate (GDP) 414 is arranged below the upper electrode 413 and also, the GDP 414 is fixed by the insulating part 412. A de-chuck gas is supplied through a pipe (P10) installed passing through the upper electrode 413 and is uniformly distributed by the GDP 414. The workpiece de-chucking device 100' performs an operation of de-chucking the workpiece 200 like the workpiece de-chucking device 100 described above with reference to FIGS. 3 to 7.

As described above, a workpiece de-chucking device of a plasma reactor and a workpiece de-chucking method using the same according to the present invention automatically recognize a circumstance within a reaction chamber, generate antistatic and cleaning plasma using an ICP source power unit, and de-chuck a workpiece from an ESC by means of a lifting unit, so the antistatic and cleaning plasma can permeate into a space between the workpiece and the ESC. As a result, a closed circuit composed of the workpiece, the ESC, and the ground is formed and, through the closed circuit, the antistatic and cleaning plasma effectively discharge residual charges existing between the workpiece and the ESC. Also, the antistatic and cleaning plasma dry-cleans the inside of the reaction chamber and the surface of the ESC, and eliminates fine dust generated while the workpiece is de-chucked from the ESC by the lifting unit.

Also, because discharge of charges existing between the workpiece and the ESC are promoted, a workpiece de-chucking time can be shortened, and a damage of the workpiece caused by the popping phenomenon or sticking phenomenon can be prevented.

Also, because the antistatic and cleaning plasma permeating into the space between the workpiece and the ESC drycleans the surface of the ESC at the same time of de-chucking the workpiece, an ESC cleaning time can be shortened.

Resultantly, a period of time of waferless in-situ chamber cleaning carried out whenever a workpiece treatment (e.g., an etching treatment) ends is shortened, so the whole process time can be shortened, and the throughput of the plasma reactor can increase.

The workpiece de-chucking device of the plasma reactor and the workpiece de-chucking method using the same generate antistatic and cleaning plasma by means of the ICP source power unit or CCP top source power unit in place of an electrode of the ESC, thus preventing a phenomenon in which charges are accumulated in the ESC by a self bias.

Also, the workpiece de-chucking device of the plasma reactor and the workpiece de-chucking method using the same does not induce the popping phenomenon, and can prevent the workpiece from leaving the original position on the ESC or being damaged because charges existing between the workpiece and the ESC are completely discharged.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A workpiece de-chucking device of a plasma reactor, the device comprising:
   a lifting unit for, in response to a lift control signal, lifting a workpiece mounted on a top surface of an ElectroStatic Chuck (ESC) and, when the workpiece is lifted, supporting the workpiece such that a gap between a central part of a bottom surface of the workpiece and the top surface of the ESC is maintained in the same state as a gap between an edge part of the bottom surface of the workpiece and the top surface of the ESC;

an Inductively Coupled Plasma (ICP) source power unit comprising an inductive coil and a Radio Frequency (RF) power source supply unit, the inductive coil being arranged outside a dielectric window installed at a top of a reaction chamber having the ESC, and forming a magnetic field when an RF power source is supplied, and the RF power source supply unit supplying the RF power source to the inductive coil in response to a source power control signal; and a controller for controlling an operation of the plasma reactor comprising the reaction chamber and, for the sake of de-chucking the workpiece, outputting the source power control signal, the lift control signal, and a de-chucking control signal, and controlling a mass flow of a de-chuck gas injected into the reaction chamber during the de-chucking of the workpiece and a pressure of the reaction chamber, wherein, as the de-chuck gas is injected into the reaction chamber and the inductive coil forms the magnetic field, antistatic and cleaning plasma is generated in the reaction chamber, in response to the de-chucking control signal, a chucking power source supply unit stops supplying a chucking power source to an electrode of the ESC and connects the electrode of the ESC to the ground, and when the workpiece is lifted by the lifting unit, the antistatic and cleaning plasma permeates into a space between the workpiece and the ESC, promotes discharge of charges existing between the workpiece and the ESC, dry-cleans a surface of the ESC and the inside of the reaction chamber, and eliminates fine dust generated while the workpiece is de-chucked from the ESC by the lifting unit.

2. The device of claim 1, wherein, for the sake of a workpiece etching process, the controller outputs the source power control signal and a chucking control signal, and controls a mass flow of an etching gas injected into the reaction chamber during the etching process and the pressure of the reaction chamber, as the etching gas is injected into the reaction chamber and the inductive coil forms the magnetic field, etching plasma is generated within the reaction chamber, and in response to the chucking control signal, the chucking power source supply unit supplies the chucking power source to the electrode of the ESC.

3. The device of claim 1, wherein, when the workpiece is de-chucked, the controller outputs the source power control signal to the RF power source supply unit, outputs the de-chucking control signal to a chucking power source supply unit, and then outputs the lift control signal to the lifting unit, and in response to the source power control signal, the RF power source supply unit supplies the RF power source of a reference power value to the inductive coil.

4. The device of claim 3, wherein the controller comprises a storage space for storing the reference power value and a de-chucking power value and, when the reference power value is not the same as the de-chucking power value, further outputs a power control signal to the RF power source supply unit before outputting the lift control signal to the lifting unit, and in response to the power control signal, the RF power source supply unit changes a power value of the RF power source supplied to the inductive coil into the de-chucking power value.

5. The device of claim 1, wherein the controller further outputs a fall control signal to the lifting unit, in response to the fall control signal, the lifting unit gets the workpiece to descend until the workpiece gets in contact with the top surface of the ESC, after executing at least once an operation of alternatively outputting the lift control signal and the fall control signal with a set delay time difference, the controller again outputs the lift control signal, and under control of the controller, after executing at least once an ascent and descent operation of the workpiece, the lifting unit lifts the workpiece in response to the lift control signal that the controller again outputs.

6. The device of claim 5, wherein the set delay time is a time (T) meeting the condition of $0<T\leq 0.6$ seconds.

7. The device of claim 5, wherein the lifting unit gets the workpiece to ascend or descend at a speed of a range of $X(3.125 \text{ mm/s} \leq X \leq 12.5 \text{ mm/s})$.

8. The device of claim 1, wherein the lifting unit comprises:
a plurality of lift pins installed passing through the ESC and, when the workpiece is lifted, supporting the bottom surface of the workpiece at their one ends;
a lift pin support installed below the ESC, and coupled to the other ends of the plurality of lift pins and supporting the plurality of lift pins;
a cylinder comprising a piston coupled to the lift pin support, and moving the piston by a pressure of air injected from the external and lifting the lift pin support; and
a cylinder driver for injecting air into the cylinder in response to the lift control signal, wherein, as the cylinder lifts the lift pin support, the plurality of lift pins ascend.

9. The device of claim 8, wherein, on the basis of sense information of a lift sensor installed at an upper part of one side of the cylinder and sensing the piston within the cylinder, the controller recognizes a time point at which the ascending of the lift pin is completed and, after the ascending of the lift pin is completed and a set delay time, the controller outputs a source power off signal to the RF power source supply unit, in response to the source power off signal, the RF power source supply unit stops supplying the RF power source to the inductive coil, and during the set delay time, the antistatic and cleaning plasma keeps dry-cleaning the surface of the ESC.

10. The device of claim 1, wherein the de-chuck gas comprises argon (Ar), oxygen ($O_2$), or a mixture of argon (Ar) and oxygen ($O_2$).

* * * * *